(12) United States Patent
Lee et al.

(10) Patent No.: US 10,504,993 B2
(45) Date of Patent: Dec. 10, 2019

(54) FINFET SEMICONDUCTOR DEVICE WITH GERMANIUM DIFFUSION OVER SILICON FINS

(71) Applicant: Taiwan Semiconductor Manufacturing Company, Ltd., Hsin-Chu (TW)

(72) Inventors: Yi-Jing Lee, Hsin-Chu (TW); Cheng-Hsien Wu, Hsin-Chu (TW); Chih-Hsin Ko, Fongshan (TW); Clement Hsingjen Wann, Carmel, NY (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/383,974

(22) Filed: Dec. 19, 2016

(65) Prior Publication Data
US 2017/0104067 A1    Apr. 13, 2017

Related U.S. Application Data

(62) Division of application No. 14/158,547, filed on Jan. 17, 2014, now Pat. No. 9,530,776.

(51) Int. Cl.
| | | |
|---|---|---|
| *H01L 29/10* | (2006.01) |
| *H01L 27/088* | (2006.01) |
| *H01L 21/8234* | (2006.01) |
| *H01L 21/02* | (2006.01) |
| *H01L 21/225* | (2006.01) |
| *H01L 29/66* | (2006.01) |
| *H01L 29/78* | (2006.01) |
| *H01L 21/306* | (2006.01) |
| *H01L 21/3065* | (2006.01) |
| *H01L 21/324* | (2006.01) |

(Continued)

(52) U.S. Cl.
CPC .... *H01L 29/1054* (2013.01); *H01L 21/02532* (2013.01); *H01L 21/2251* (2013.01); *H01L 21/3065* (2013.01); *H01L 21/30625* (2013.01); *H01L 21/324* (2013.01); *H01L 21/823412* (2013.01); *H01L 21/823431* (2013.01); *H01L 21/823481* (2013.01); *H01L 27/0886* (2013.01); *H01L 29/0653* (2013.01); *H01L 29/161* (2013.01); *H01L 29/66795* (2013.01); *H01L 29/66818* (2013.01); *H01L 29/7851* (2013.01); *H01L 29/7854* (2013.01); *H01L 29/165* (2013.01)

(58) Field of Classification Search
CPC ............... H01L 21/02532; H01L 29/1054
See application file for complete search history.

(56) References Cited

U.S. PATENT DOCUMENTS

| | | | |
|---|---|---|---|
| 9,324,818 B2 | 4/2016 | Waldron et al. | |
| 2007/0145487 A1* | 6/2007 | Kavalieros | ........ H01L 29/66628 257/368 |

(Continued)

*Primary Examiner* — Xia L Cross
(74) *Attorney, Agent, or Firm* — Slater Matsil, LLP (57) ABSTRACT

A method for manufacturing a semiconductor device is described that comprises providing a substrate, forming a plurality of fins having a first semiconductor material, replacing a first portion of at least one of the fins with a second semiconductor material, and distributing the second semiconductor material from the first portion to a second portion of the at least one of the fins.

20 Claims, 8 Drawing Sheets

(51) Int. Cl.
  *H01L 29/06* (2006.01)
  *H01L 29/161* (2006.01)
  *H01L 29/165* (2006.01)

(56) References Cited

U.S. PATENT DOCUMENTS

| | | |
|---|---|---|
| 2011/0147811 A1 | 6/2011 | Kavalieros et al. |
| 2011/0169049 A1 | 7/2011 | Loo et al. |
| 2011/0195555 A1* | 8/2011 | Tsai .................... H01L 21/2236 438/301 |
| 2012/0091528 A1* | 4/2012 | Chang ................. H01L 29/7848 257/347 |
| 2013/0052801 A1 | 2/2013 | Berliner et al. |
| 2013/0234147 A1 | 9/2013 | Wu et al. |
| 2013/0285155 A1* | 10/2013 | Glass ................. H01L 29/0847 257/369 |
| 2014/0252483 A1 | 9/2014 | Nagumo |
| 2014/0264489 A1 | 9/2014 | Wong et al. |
| 2015/0194525 A1 | 7/2015 | Xu et al. |

\* cited by examiner

FINFET SEMICONDUCTOR DEVICE WITH GERMANIUM DIFFUSION OVER SILICON FINS

This application is a divisional application and claims the benefit of U.S. application Ser. No. 14/158,547, filed Jan. 17, 2014, entitled "FinFET Semiconductor Device with Germanium Diffusion Over Silicon Fins," which application is incorporated herein by reference in its entirety.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as FinFET devices, because the channel is formed on a "fin" that extends from the substrate. FinFET devices may allow for shrinking the gate width of the device while providing a gate on the sides and/or top of the fin including the channel region.

In addition, with the use of high-k dielectric materials in the gate dielectrics of MOS transistors, the convenience provided by using silicon oxide is no longer a big advantage, and hence germanium is reexamined for use in integrated circuits. Recent studies of using germanium in Fin field-effect transistors (FinFETs) have been reported. However, the technology and materials for processing silicon germanium, for example, selecting and controlling the chemicals for processing and depositing silicon germanium, are still being explored.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
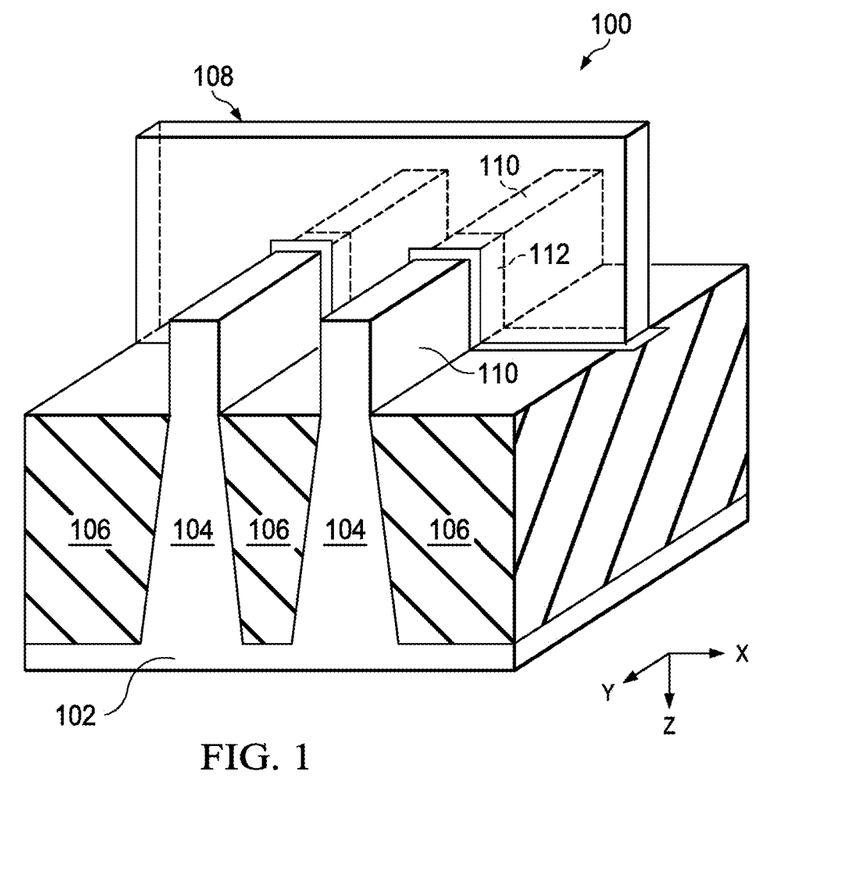
FIG. 1 illustrates a perspective view of an embodiment of a semiconductor device according to embodiments of the present disclosure.

Illustrated in FIG. 1 is a semiconductor device 100. The semiconductor device 100 includes FinFET type device(s). Semiconductor device 100 may be an n-type FinFET or a p-type FinFET. Semiconductor device 100 may be included in an IC such as a microprocessor, memory device, and/or other IC. Device 100 includes a substrate 102, a plurality of fins 104, a plurality of isolation structures 106, and a gate structure 108 disposed on each of fins 104. Each of fins 104 includes a source/drain region denoted 110 where a source or drain feature is formed in, on, and/or surrounding fin 104. A channel region of fin 104 underlies gate structure 108 and is denoted as 112.

Substrate 102 may be a silicon substrate. Alternatively, substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, substrate 102 is a semiconductor on insulator (SOI) substrate.

Isolation structures 106 may be formed of silicon oxide, silicon nitride, silicon oxynitride, fluoride-doped silicate glass (FSG), a low-k dielectric material, and/or other suitable insulating material. Isolation structures 106 may be shallow trench isolation (STI) features. In an embodiment, isolation structures 106 are STI features and are formed by etching trenches in substrate 102. The trenches may then be filled with isolating material, followed by a chemical mechanical polish (CMP). Other fabrication techniques for isolation structures 106 and/or fin structures 104 are possible. Isolation structures 106 may include a multi-layer structure, for example, having one or more liner layers.

Fin structures 104 may provide an active region where one or more devices are formed. In an embodiment, a channel of a transistor device is formed in fins 104. Fins 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form fins 104 on substrate 102 may be suitable.

In an embodiment, fins 104 are approximately 10 nanometer (nm) wide and between approximately 15 nm and 40 nm high (as measured from height of fins 104 above isolation region 106). However, it should be understood that other dimensions may be used for fins 104. Fin 104 may be doped using n-type and/or p-type dopants.

Gate structure 108 may include a gate dielectric layer, a work function layer, and/or one or more additional layers. In an embodiment, gate structure 108 includes a silicide layer such as described in the embodiments below. The silicide layer may overlie the gate dielectric layer and/or the work function layer.

In an embodiment, semiconductor device 100 is provided during fabrication and gate structure 108 is a sacrificial gate structure such as formed in a replacement gate process used to form a metal gate structure. In an embodiment, gate structure 108 includes polysilicon. In another embodiment, gate structure 108 includes a metal gate structure.

A gate dielectric layer of gate structure 108 may include silicon dioxide. The silicon oxide may be formed by suitable oxidation and/or deposition methods. Alternatively, the gate dielectric layer of gate structure 108 may include a high-k dielectric layer such as hafnium oxide (HfO2). Alternatively, the high-k dielectric layer may optionally include other high-k dielectrics, such as TiO2, HfZrO, Ta2O3, HfSiO4, ZrO2, ZrSiO2, combinations thereof, or other suitable material. The high-k dielectric layer may be formed by atomic layer deposition (ALD) and/or other suitable methods.

In an embodiment, gate structure 108 may be a metal gate structure. The metal gate structure may include interfacial layer(s), gate dielectric layer(s), work function layer(s), silicide layers as described below, fill metal layer(s), and/or other suitable materials for a metal gate structure. In other embodiments, metal gate structure 108 may further include capping layers, etch stop layers, and/or other suitable materials. The interfacial layer may include a dielectric material such as silicon oxide layer (SiO2) or silicon oxynitride (SiON). The interfacial dielectric layer may be formed by chemical oxidation, thermal oxidation, atomic layer deposition (ALD), CVD, and/or other suitable dielectric.

Exemplary p-type work function metals that may be included in the gate structure 108 include TiN, TaN, Ru, Mo, Al, WN, ZrSi2, MoSi2, TaSi2, NiSi2, WN, other suitable p-type work function materials, or combinations thereof. Exemplary n-type work function metals that may be included in gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure. The silicide layer may interpose the work function layer and the fill metal.

Semiconductor device 100 may include other layers and/or features not specifically illustrated including additional source/drain regions, interlayer dielectric (ILD) layers, contacts, interconnects, and/or other suitable features.

Figure 2:
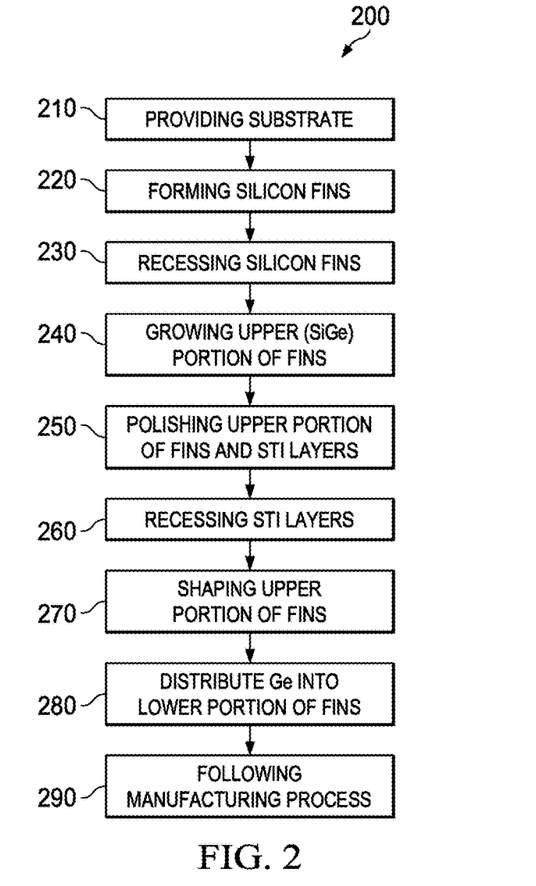
FIG. 2 illustrates a flowchart illustrating a method for of manufacturing a FinFET according to embodiments of the present disclosure.

Referring to FIG. 2, illustrated is a flowchart of method 200 for of fabricating a fin field effect transistor (FinFET) according to embodiments of the present disclosure. Method 200 begins with a step 210 in which a substrate is provided. Method 200 continues with a step 220 in which silicon fins are formed in the substrate. Method 200 continues with a step 230 in which the silicon fins are recessed. Method 200 continues with a step 240 in which upper portion, e.g., Silicon-Germanium (SiGe) portion, of the fins are formed. Method 200 continues with a step 250 in which the upper portion of the fins and STI layers are polished. Method 200 continues with a step 260 in which STI layers are recessed. Method 200 continues with a step 270 in which the upper portion of the fins are shaped. Method 200 continues with a step 280 in which Germanium (Ge) is distributed into lower portion of the fins. Method 200 continues with a step 290 in which following manufacturing processes are performed.

As employed in the present disclosure, a FinFET refers to any fin-based, multi-gate transistor. In various embodiments of the present disclosure, the present disclosure, a FinFET may be included in a microprocessor, memory cell, and/or other integrated circuit (IC). It is noted that the method of FIG. 2 does not produce a completed FinFET. In embodiments of the present disclosure, a completed FinFET may be fabricated using complementary metal-oxide-semiconductor (CMOS) technology processing. Accordingly, it is understood that additional processes may be provided before, during, and after method 200 of FIG. 2, and that some other processes may only be briefly described herein. Also, all the figures in the present disclosure are simplified for a better understanding of the inventive concepts of the present disclosure. For example, although the figures illustrate a FinFET, it is understood the IC may comprise a number of other devices comprising resistors, capacitors, inductors, fuses, etc.

Referring to FIGS. 3-10, illustrated are various perspective and cross-sectional views of a FinFET structure at various stages of fabrication according to embodiments of the present disclosure.

Figure 3:
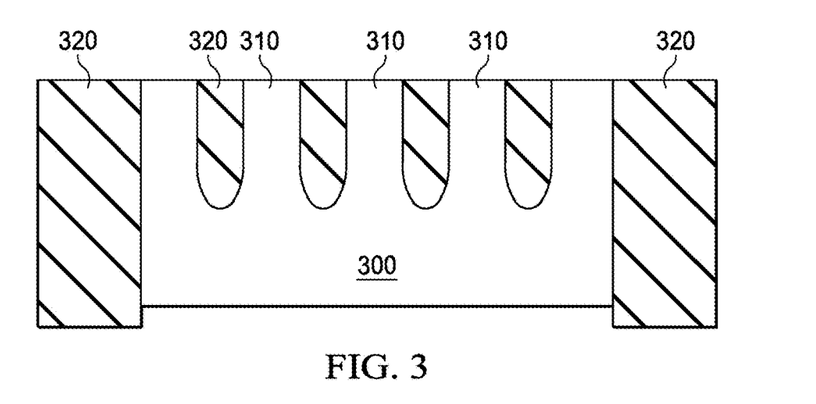
FIGS. 3-19 illustrate various perspective and cross-sectional views of a FinFET at various stages of fabrication according to embodiments of the present disclosure.

Referring back to FIG. 2, method 200 of various embodiments of the present disclosure begins with step 210 in which a substrate 300 (as shown in FIG. 3) is provided. In embodiments of the present disclosure, substrate 300 may be consistent with substrate 102 of FIG. 1. In embodiments of the present disclosure, substrate 300 comprises a crystalline silicon substrate (e.g., wafer). In other embodiments of the present disclosure, substrate 300 may comprise various doped regions depending on design requirements (e.g., p-type substrate or n-type substrate). In some other embodiments, the doped regions may be doped with p-type or n-type dopants. For example, the doped regions may be doped with p-type dopants, such as boron or BF2; n-type dopants, such as phosphorus or arsenic; and/or combinations thereof. The doped regions may be configured for an n-type FinFET, or alternatively configured for a p-type FinFET.

In some other embodiments, substrate 300 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In still some other embodiments, substrate 300 may include an epitaxial layer (epi-layer), may be strained for performance enhancement, and/or may include a silicon-on-insulator (SOI) structure.

Referring back to FIG. 2, method 200 of embodiments of the present disclosure continues with step 220 in which fins 310 are formed, as shown in FIG. 3. In embodiments of the present disclosure, fins 310 are formed by etching into substrate 300. It should be noted that FIG. 3 is a cross-sectional view of a FinFET structure according to embodiments of the present disclosure. FIG. 3 illustrates a cross-sectional view of the FinFET structure taken along a direction in parallel with an X-direction of semiconductor device 100 shown in FIG. 1. Accordingly, the direction illustrated in FIG. 3 is in parallel with the direction of the width of fins 310.

It should be noted that the number of fins 310 is not limited by the semiconductor structure shown in FIG. 3 and can include more or less than that depicted in FIG. 3. In embodiments of the present disclosure, fins 310 may be simultaneously formed, such that each fin 310 may comprise the same materials or layers.

In embodiments of the present disclosure, a shallow trench isolation (STI) layer 320 is formed over the substrate such that spaces among fins 310 are filled with STI layer 320, as shown in FIG. 3. In embodiments of the present disclosure, STI layer 320 herein may correspond to isolation layer 106 of FIG. 1. In embodiments of the present disclosure, STI layer 320 may comprise silicon oxide, silicon nitride, silicon oxynitride, other suitable materials, or combinations thereof. STI layer 320 may be formed by any suitable process. In embodiments of the present disclosure, forming STI layer 320 may include forming trenches, and then filling trench (for example, by using a chemical vapor deposition process) with one or more dielectric materials. In embodiments of the present disclosure, trenches may be strips (viewed from in the top of the FinFET structure) parallel to each other, and closely spaced with respect to each other. Trenches each has a width, a depth, and are spaced apart from adjacent trenches. For example, the spacing between trenches may be smaller than about 30 nm. In embodiments of the present disclosure, trenches may be continuous and surrounding fins 310 (as shown in FIG. 3).

Then, liner oxide is optionally formed in the trenches. In embodiments of the present disclosure, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches, which reduces the electrical fields, and hence improves the performance of the resulting integrated circuit. In embodiments of the present disclosure, trenches are then filled with a dielectric material. The dielectric material may include silicon oxide, and hence is also referred to as oxide in embodiments of the present disclosure. In some embodiments, other dielectric materials, such as silicon nitride, silicon oxynitride, fluoride-doped silicate glass (FSG), or a low-K dielectric material, may also be used. In some other embodiments, the oxide may be formed using a high-density-plasma (HDP) CVD process, using silane (SiH4) and oxygen (O2) as reacting precursors. In still some other embodiments, the oxide may be formed using a sub-atmospheric CVD (SACVD) process or high aspect-ratio process (HARP), wherein process gases may comprise tetraethylorthosilicate (TEOS) and/or ozone (O3). In yet other embodiments, the oxide may be formed using a spin-on-dielectric (SOD) process, such as hydrogen silsesquioxane (HSQ) or methyl silsesquioxane (MSQ).

In embodiments of the present disclosure, STI layer 320 may have a multi-layer structure such as a thermal oxide liner layer filled with silicon nitride or silicon oxide.

Figure 4:
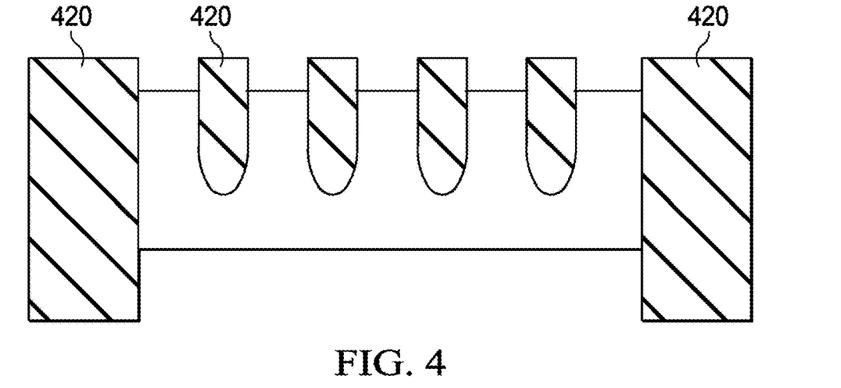

FIG. 4 illustrates a cross-sectional view of a FinFET structure at one of various stages of fabrication according to embodiments of the present disclosure. It should be noted that FIG. 4 illustrates a cross-sectional view of the FinFET structure taken along a direction in parallel with the X-direction of semiconductor device 100 shown in FIG. 1. Accordingly, the direction illustrated in FIG. 4 is in parallel with the direction of the width of the fins.

Referring back to FIG. 2, method 200 of embodiments of the present disclosure continues with step 230 in which silicon fins 310 are recessed, as shown in FIG. 4. In embodiments of the present disclosure, a chemical mechanical polish (CMP) is then performed. The remaining portions of STI layers 320 shown in FIG. 3 are hereinafter referred to STI layers 420 shown in FIG. 4. Then, the upper portion of fins 310 is recessed by an etching step, as shown in FIG. 4. In embodiments of the present disclosure, the etching step may be performed using a wet etching process, for example, by dipping substrate 300 in hydrofluoric acid (HF). In some other embodiments, the etching step may be performed using a dry etching process, for example, the dry etching process may be performed using CHF3 or BF3 as etching gases.

Figure 5:
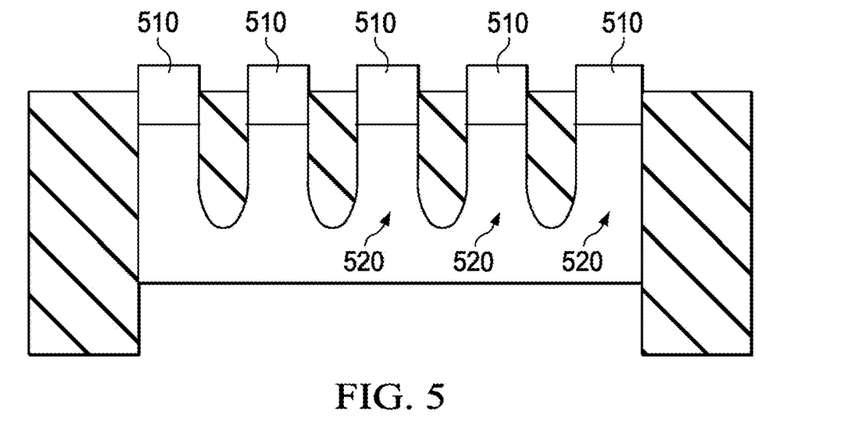

FIG. 5 illustrates a cross-sectional view of a FinFET structure at one of various stages of fabrication according to embodiments of the present disclosure. It should be noted that FIG. 5 illustrates a cross-sectional view of the FinFET structure taken along a direction in parallel with the X-direction of semiconductor device 100 shown in FIG. 1. Accordingly, the direction illustrated in FIG. 5 is in parallel with the direction of the width of fins.

Referring back to FIG. 2, method 200 of embodiments of the present disclosure continues with step 240 in which the Silicon-Germanium (SiGe) material is formed over the upper portion of fins 310, as shown in FIG. 5. In step 240, a different material such as $SiGe_X$ ($0<x<1$) is grown to fill the recessed (upper) portion of fins. In embodiments of the present disclosure, upper portion 510 of the fins such as $SiGe_X$ and lower portion 520 of the fin such as Si comprise different materials. By replacing the semiconductor material of the upper portion of the fins, the performance of the FinFET may be enhanced. In embodiments of the present disclosure, the SiGe material may be deposited by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fins. In embodiments of the present disclosure, other semiconductor materials such as SiP, SiC, SiCP, or a combination thereof may be used to form upper portion 510 of the fins.

Figure 6:
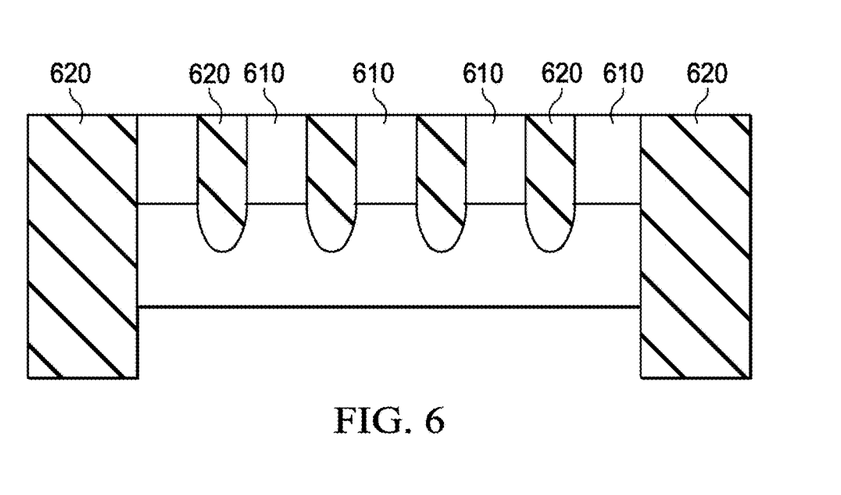

FIG. 6 illustrates a cross-sectional view of a FinFET structure at one of various stages of fabrication according to embodiments of the present disclosure. It should be noted that FIG. 6 illustrates a cross-sectional view of the FinFET structure taken along a direction in parallel with the X-direction of semiconductor device 100 shown in FIG. 1. Accordingly, the direction illustrated in FIG. 6 is in parallel with the direction of the width of fins.

Referring back to FIG. 2, method 200 of embodiments of the present disclosure continues with step 250 in which upper portion (SiGe portion) of fins 610 and upper portion of STI layers 620 are polished, as shown in FIG. 6. In embodiments of the present disclosure, a chemical mechanical polish (CMP) is performed. The remaining portions of STI layers 420 shown in FIG. 4 are hereinafter referred to STI layers 620 shown in FIG. 6 and the remaining portions of upper portion of fins 510 shown in FIG. 5 are hereinafter referred to upper portion (SiGe portion) of fins 610 shown in FIG. 6.

Figure 7:
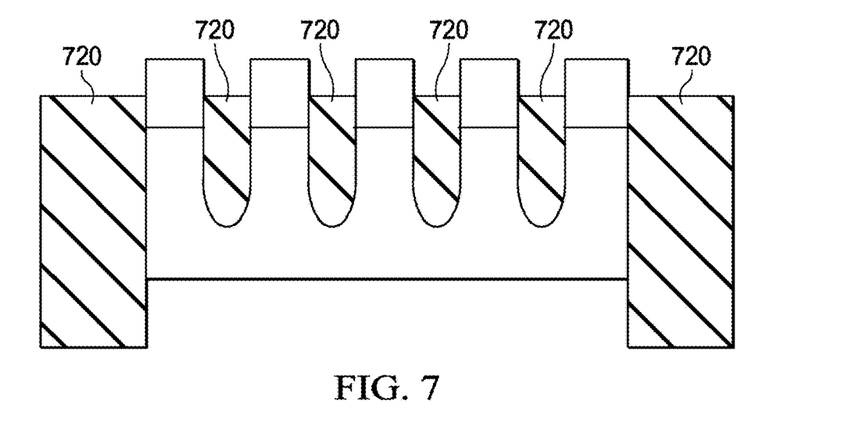

FIG. 7 illustrates a cross-sectional view of a FinFET structure at one of various stages of fabrication according to embodiments of the present disclosure. It should be noted that FIG. 7 illustrates a cross-sectional view of the FinFET structure taken along a direction in parallel with the X-direction of semiconductor device 100 shown in FIG. 1. Accordingly, the direction illustrated in FIG. 7 is in parallel with the direction of the width of fins.

Referring back to FIG. 2, method 200 of embodiments of the present disclosure continues with step 260 in which STI layers 620 are recessed, as shown in FIG. 7. The remaining portions of STI layers 620 shown in FIG. 6 are hereinafter referred to STI layers 720 shown in FIG. 7. In embodiments of the present disclosure, the upper portion of STI layers 620 in FIG. 6 is recessed by an etching step. In embodiments of the present disclosure, the etching step may be performed using a wet etching process, for example, by dipping STI layers 620 in hydrofluoric acid (HF). In some other embodiments, the etching step may be performed using a dry etching process, for example, the dry etching process may be performed using CHF3 or BF3 as etching gases.

Figure 8:
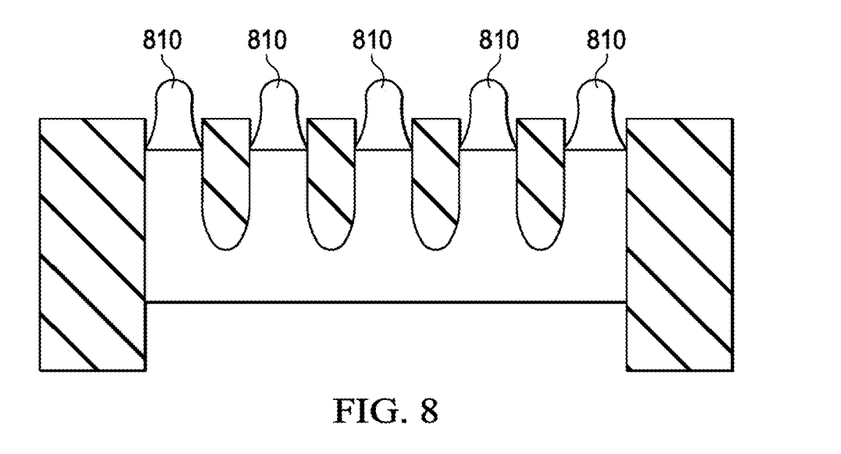

FIG. 8 illustrates a cross-sectional view of a FinFET structure at one of various stages of fabrication according to embodiments of the present disclosure. It should be noted that FIG. 8 illustrates a cross-sectional view of the FinFET structure taken along a direction in parallel with the X-direction of semiconductor device 100 shown in FIG. 1. Accordingly, the direction illustrated in FIG. 8 is in parallel with the direction of the width of fins.

Referring back to FIG. 2, method 200 of embodiments of the present disclosure continues with step 270 in which the upper portion (SiGe portion) of fins 810 are shaped, as shown in FIG. 8. In step 270, a portion of the upper portion of at least one of fins 810 is removed by etching. In embodiment of the present disclosure, various etching methods may be applied directly to fins 810 to change their shapes. The various etching methods may include dry etching, wet etching, isotropic etching, anisotropic etching, or different combinations that may shape fins 810 into different shapes.

In embodiments of the present disclosure, fins 810 may be shaped by wet etching by using OH-based solution. In other embodiments, the etching method may be isotropic etching that may include dry etching methods using plasma or wet etching methods. In embodiments, an outer layer of fins 810 may be removed by using a buffered oxide etch or a mixture of ammonium fluoride and hydrofluoric acid in a wet etch. Plasma etching may involve non-biased plasma, including remotely generated plasma to remove an outer layer. In some other embodiments, a remotely generated $SF_6$ plasma with oxygen may be used. In some embodiments of the present disclosure, various fluorine-based plasma, such as $XeF_2$ and $BrF_3$, may be used in plasma etching to isotropically reshape fins 810. In some other embodiments, plasma etching using polymerization techniques may result in moderately anisotropic etching targeting only a top portion of fins 810. Polymer byproducts from etching deposits on the sidewalls creates a protect layer. With this technique, the polymer residue must be removed in subsequent processing. Carbon-rich fluorocarbon or hydrofluorocarbon plasma may be used. In some other embodiments, wet etching using anisotropic etchants may shape fins 810 according to the crystal orientation. Anisotropic wet etching that removes SiGe portion at orientation plane dependent rates includes using tetramethylammonium hydroxide (TMAH), potassium hydroxide (KOH) or another strong alkaline etchant (pH>12) to etch SiGe. In still some other embodiments of the present disclosure, isotropic wet etching may uniformly remove the upper portion of fins 810 from all directions that is not protected. Isotropic etching may use a combination of hydrofluoric acid (HF) with a number of additives such as nitric acid (HNO3), citric acid (CH3COOH), sodium chlorite (NaClO2), perchloric acid (HClO4), fresh potassium permanganate (KMnO4), or combinations of these additives. These chemical mixtures tend to uniformly remove the materials of fins 810.

Figure 9:
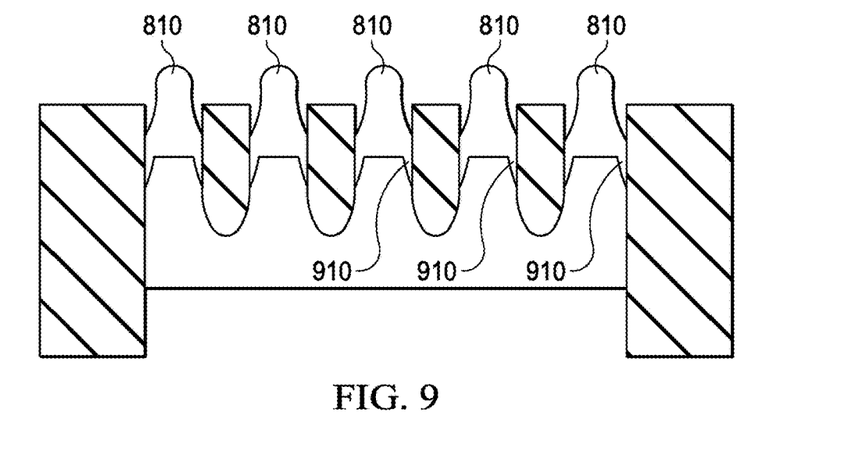

FIG. 9 illustrates a cross-sectional view of a FinFET structure at one of various stages of fabrication according to embodiments of the present disclosure. It should be noted that FIG. 9 illustrates a cross-sectional view of the FinFET structure taken along a direction in parallel with the X-direction of semiconductor device 100 shown in FIG. 1. Accordingly, the direction illustrated in FIG. 9 is in parallel with the direction of the width of fins.

Referring back to FIG. 2, method 200 of embodiments of the present disclosure continues with step 280 in which germanium (Ge) 910 is distributed to of lower portion of fins, as shown in FIG. 9. In embodiments of the present disclosure, Ge within $SiGe_X$ materials in the upper portion of fins 810 may be diffused into lower portion of fins 920 by thermal treatment, such as an anneal activation in temperatures between 900 degree Celsius and 1100 degree Celsius. It should be noted that the temperature for Ge diffusion depends upon the concentration of Ge within $SiGe_X$ materials. For the SiGex materials with higher Ge concentration, Ge diffusion happens at the range between 900 degree Celsius and 1100 degree Celsius. In some embodiments of the present disclosure, the thermal treatment may be a separate step following the steps disclosed herein. In other embodiments, the thermal treatment may be a thermal budget in the subsequent processes.

Figure 10:
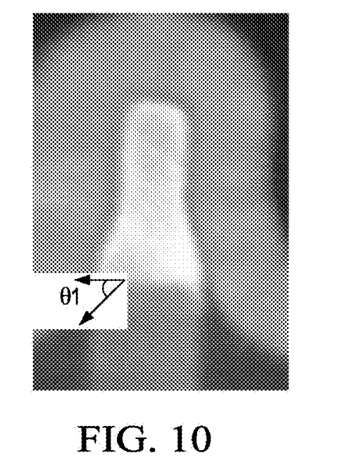

FIG. 10 illustrates a cross-sectional view of a FinFET structure at one of various stages of fabrication according to embodiments of the present disclosure. It should be noted that FIG. 10 illustrates a cross-sectional view of the FinFET structure taken along a direction in parallel with the X-direction of semiconductor device 100 shown in FIG. 1. Accordingly, the direction illustrated in FIG. 10 is in parallel with the direction of the width of fins. Referring to FIG. 10, in embodiments of the present disclosure, germanium is diffused along the sidewalls of the lower (silicon) portion of fins such that the interface between the Si portion and the SiGe portion of fins is a convex surface. In embodiments of the present disclosure, the range of angle THETA 1 shown in FIG. 10 is between 20 and 80 degrees.

Referring back to FIG. 2, method 200 of embodiments of the present disclosure continues with step 290 in which following manufacturing process are performed. In embodiments of the present disclosure, method 200 may continue to include further CMOS or MOS technology processing to form various features known in the art. Exemplary processes that may be performed include the formation of gate structure, the formation of inter-layer dielectric (ILD) layer, and the formation of contact features coupled to the gate structure.

Figure 18:
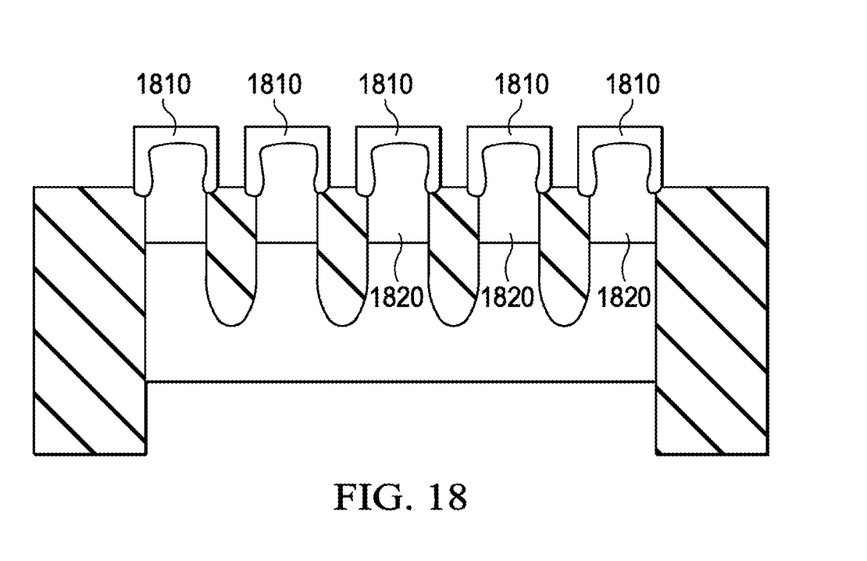
Figure 19:
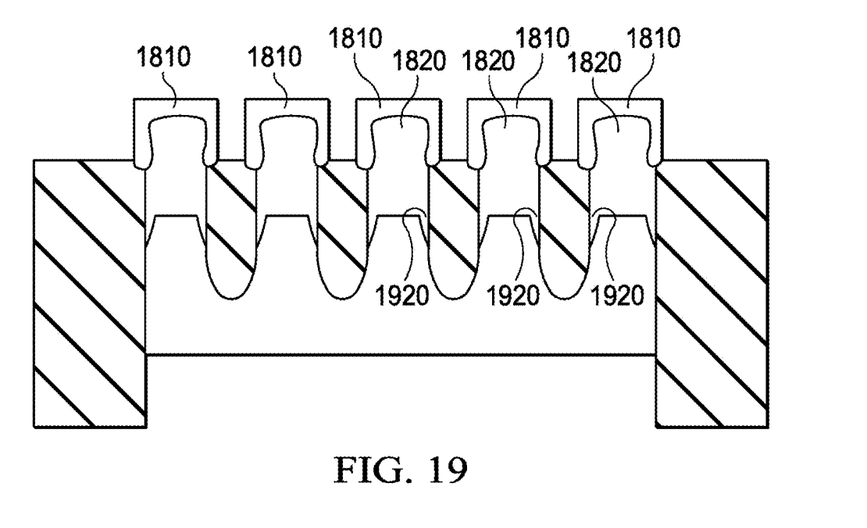

Referring to FIGS. 18-19, illustrated are cross-sectional views of a FinFET structure at various stages of fabrication according to some other embodiments of the present disclosure. In embodiments of the present disclosure, shaping upper portion 1820 of the fins may be an optional step. In addition, an additional step in which a cap layer 1810 may be formed over upper portion 1820 of the fins, is shown in FIG. 18. In embodiments of the present disclosure, the material of cap layer 1810 may be different from that of upper portion 1820 of the fins. In embodiments of the present disclosure, the material of cap layer 1810 is $SiGe_Y$ (0<y<1) that is different from the material of upper portion 1820 of the fins $SiGe_X$ (0<x<1). Accordingly, the concentration of germanium in cap layer 1810 is different from that in upper portion 1820 of the fins.

In step 290, germanium (Ge) in upper portion 1820 may be distributed to of lower portion of fins, as shown in FIG. 19. In embodiments of the present disclosure, Ge in upper portion 1820 of fins may be diffused into lower portion 1920 of fins by thermal treatment, such as an anneal activation in temperatures between 900 degree Celsius and 1100 degree Celsius. It should be noted that the temperature for Ge diffusion depends upon the concentration of Ge within $SiGe_X$ materials. For the $SiGe_X$ materials with higher Ge concentration, Ge diffusion happens at the range between 900 degree Celsius and 1100 degree Celsius. In some embodiments of the present disclosure, the thermal treatment may be a separate step following the steps disclosed herein. In other embodiments, the thermal treatment may be a thermal budget in the subsequent processes.

Referring to FIGS. 11-16, illustrated are cross-sectional views of a FinFET structure at various stages of fabrication according to some other embodiments of the present disclosure.

Figure 11:
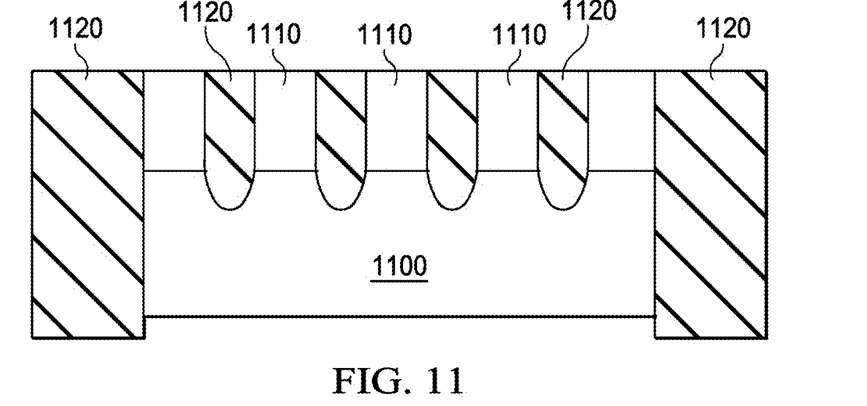

Referring back to FIG. 2, method 200 of various embodiments of the present disclosure begins with step 210 in which a substrate 1100 (as shown in FIG. 11) is provided. In embodiments of the present disclosure, substrate 1100 may be consistent with substrate 300 of FIG. 3. In embodiments of the present disclosure, substrate 1100 comprises a crystalline silicon substrate (e.g., wafer). In other embodiments of the present disclosure, substrate 1100 may comprise various doped regions depending on design requirements (e.g., p-type substrate or n-type substrate). In some other embodiments, the doped regions may be doped with p-type or n-type dopants. For example, the doped regions may be doped with p-type dopants, such as boron or BF2; n-type dopants, such as phosphorus or arsenic; and/or combinations thereof. The doped regions may be configured for an n-type FinFET, or alternatively configured for a p-type FinFET.

In some other embodiments, substrate 1100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In still some other embodiments, substrate 1100 may include an epitaxial layer (epi-layer), may be strained for performance enhancement, and/or may include a silicon-on-insulator (SOI) structure.

Referring back to FIG. 2, method 200 of embodiments of the present disclosure continues with step 220 in which fins 1110 are formed, as shown in FIG. 11. In embodiments of the present disclosure, fins 1110 are formed by etching into substrate 1100. It should be noted that FIG. 11 is a cross-sectional view of a FinFET structure according to embodiments of the present disclosure. FIG. 11 illustrates a cross-sectional view of the FinFET structure taken along a direction in parallel with an X-direction of semiconductor device 100 shown in FIG. 1. Accordingly, the direction illustrated in FIG. 11 is in parallel with the direction of the width of fins 310.

It should be noted that the number of fins 1110 is not limited by the semiconductor structure shown in FIG. 11 and can include more or less than that depicted in FIG. 11. In embodiments of the present disclosure, fins 1110 may be simultaneously formed, such that each fin 1110 may comprise the same materials or layers.

In embodiments of the present disclosure, a shallow trench isolation (STI) layer 1120 is formed over the substrate such that spaces among fins 1110 are filled with STI layer 1120, as shown in FIG. 11. In embodiments of the present disclosure, STI layer 1120 herein may correspond to isolation layer 106 of FIG. 1. In embodiments of the present disclosure, STI layer 1120 may comprise silicon oxide, silicon nitride, silicon oxynitride, other suitable materials, or combinations thereof. STI layer 1120 may be formed by any suitable process. In embodiments of the present disclosure, forming STI layer 1120 may include forming trenches, and then filling trench (for example, by using a chemical vapor deposition process) with one or more dielectric materials. In embodiments of the present disclosure, trenches may be strips (viewed from in the top of the FinFET structure) parallel to each other, and closely spaced with respect to each other. Trenches each has a width, a depth, and are spaced apart from adjacent trenches. For example, the spacing between trenches may be smaller than about 30 nm. In embodiments of the present disclosure, trenches may be continuous and surrounding fins 1110 (as shown in FIG. 11).

Then, liner oxide is optionally formed in the trenches. In embodiments of the present disclosure, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches, which reduces the electrical fields, and hence improves the performance of the resulting integrated circuit. In embodiments of the present disclosure, trenches are then filled with a dielectric material. The dielectric material may include silicon oxide, and hence is also referred to as oxide in embodiments of the present disclosure. In some embodiments, other dielectric materials, such as silicon nitride, silicon oxynitride, fluoride-doped silicate glass (FSG), or a low-K dielectric material, may also be used. In some other embodiments, the oxide may be formed using a high-density-plasma (HDP) CVD process, using silane (SiH4) and oxygen (O2) as reacting precursors. In still some other embodiments, the oxide may be formed using a sub-atmospheric CVD (SACVD) process or high aspect-ratio process (HARP), wherein process gases may comprise tetraethyl-orthosilicate (TEOS) and/or ozone (O3). In yet other embodiments, the oxide may be formed using a spin-on-dielectric (SOD) process, such as hydrogen silsesquioxane (HSQ) or methyl silsesquioxane (MSQ).

In embodiments of the present disclosure, STI layer 1120 may have a multi-layer structure such as a thermal oxide liner layer filled with silicon nitride or silicon oxide.

Figure 12:
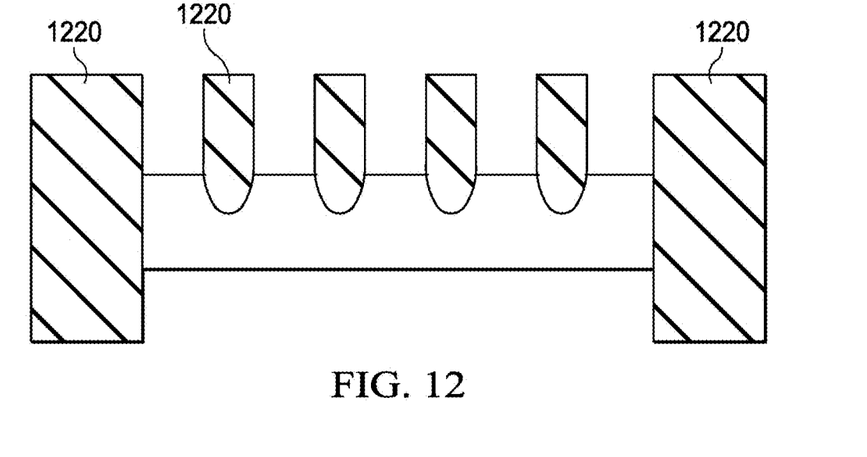

FIG. 12 illustrates a cross-sectional view of a FinFET structure at one of various stages of fabrication according to embodiments of the present disclosure. It should be noted that FIG. 12 illustrates a cross-sectional view of the FinFET structure taken along a direction in parallel with the X-direction of semiconductor device 100 shown in FIG. 1. Accordingly, the direction illustrated in FIG. 12 is in parallel with the direction of the width of the fins.

Referring back to FIG. 2, method 200 of embodiments of the present disclosure continues with step 230 in which silicon fins 1110 are recessed, as shown in FIG. 12. In embodiments of the present disclosure, a chemical mechanical polish (CMP) is then performed. The remaining portions of STI layers 1120 shown in FIG. 11 are hereinafter referred to as STI layers 1220 shown in FIG. 12. Then, the upper portion of fins 1110 is recessed by an etching step, as shown in FIG. 12. In embodiments of the present disclosure, the etching step may be performed using a wet etching process, for example, by dipping substrate 1100 in hydrofluoric acid (HF). In some other embodiments, the etching step may be performed using a dry etching process, for example, the dry etching process may be performed using CHF3 or BF3 as etching gases.

Figure 13:
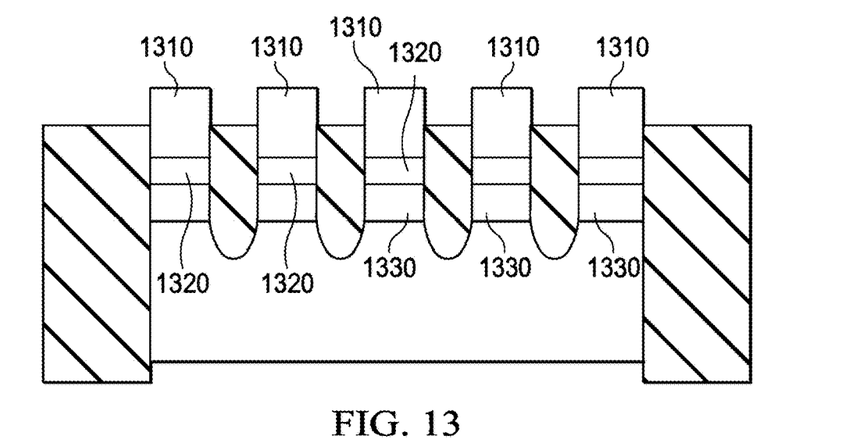

FIG. 13 illustrates a cross-sectional view of a FinFET structure at one of various stages of fabrication according to embodiments of the present disclosure. It should be noted that FIG. 13 illustrates a cross-sectional view of the FinFET structure taken along a direction in parallel with the X-direction of semiconductor device 100 shown in FIG. 1. Accordingly, the direction illustrated in FIG. 13 is in parallel with the direction of the width of fins.

Referring back to FIG. 2, method 200 of embodiments of the present disclosure continues with step 240 in which the Silicon-Germanium (SiGe) materials are formed over the upper portion of fins 1110, as shown in FIG. 13. In embodiments of the present disclosure, two different material such as $SiGe_X$ ($0<x<1$) and $SiGe_Y$ ($0<y<1$) are grown to fill the recessed (upper) portion of fins. In embodiments of the present disclosure, upper portion of the fins and lower portion of the fins comprise different materials. In embodiments of the present disclosure, the upper portion of the fins may be divided into three layers such that each of the three layers comprises SiGe materials but the composition of Si and Ge may be different between layers. As shown in FIG. 13, the first layer 1310 and the third layer 1330 of the upper portion of the fins include $SiGe_X$ ($0<X<1$) material and the second layer 1320 of the upper portion of the fins includes $SiGe_Y$ ($0<Y<1$) material such the composition of $SiGe_X$ is different from that of $SiGe_Y$. In embodiments of the present disclosure, X is larger than Y such that the concentration of Ge in first layer 1310 is larger than that in second layer 1320. With this composition, the composition of Si and Ge may be different between first layer 1310 and second layer 1320, and between second layer 1320 and third layer 1330. By replacing the semiconductor material of the upper portion of the fins, the performance of the FinFET may be enhanced.

In embodiments of the present disclosure, the Silicon-Germanium (SiGe) materials may be deposited by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fins. In embodiments of the present disclosure, other semiconductor materials such as SiP, SiC, SiCP, or a combination thereof may be used to form first layer 1310, second layer 1320, and/or third layer 1330 of the upper portion of the fins.

Figure 14:
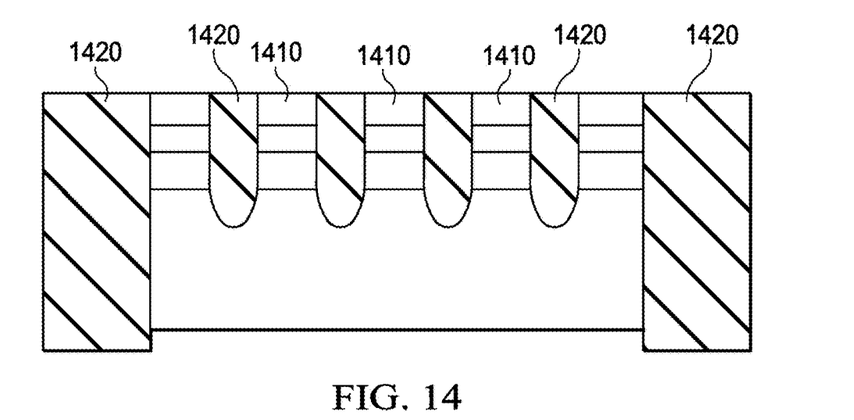

FIG. 14 illustrates a cross-sectional view of a FinFET structure at one of various stages of fabrication according to embodiments of the present disclosure. It should be noted that FIG. 14 illustrates a cross-sectional view of the FinFET structure taken along a direction in parallel with the X-direction of semiconductor device 100 shown in FIG. 1. Accordingly, the direction illustrated in FIG. 14 is in parallel with the direction of the width of fins.

Referring back to FIG. 2, method 200 of embodiments of the present disclosure continues with step 250 in which upper portion of fins 1310 (shown in FIG. 13) and upper portion of STI layers 1220 (shown in FIG. 12) are polished. In embodiments of the present disclosure, a chemical mechanical polish (CMP) is performed. The remaining portions of STI layers 1220 shown in FIG. 12 are hereinafter referred to STI layers 1420 shown in FIG. 14 and the remaining first layer of the upper portion of fins 1310 shown in FIG. 13 are hereinafter referred to first layer 1410 of the upper portion of the fins shown in FIG. 14.

Figure 15:
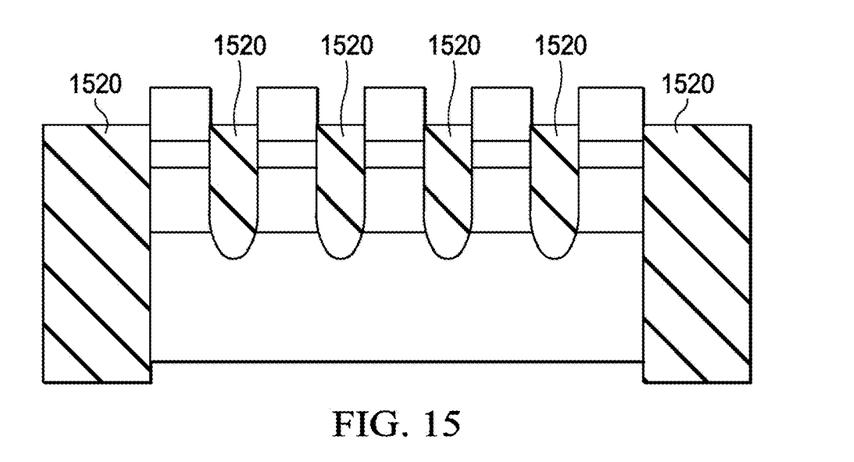

FIG. 15 illustrates a cross-sectional view of a FinFET structure at one of various stages of fabrication according to embodiments of the present disclosure. It should be noted that FIG. 15 illustrates a cross-sectional view of the FinFET structure taken along a direction in parallel with the X-direction of semiconductor device 100 shown in FIG. 1. Accordingly, the direction illustrated in FIG. 15 is in parallel with the direction of the width of fins.

Referring back to FIG. 2, method 200 of embodiments of the present disclosure continues with step 260 in which STI layers 1420 are recessed, as shown in FIG. 15. The remaining portions of STI layers 1420 shown in FIG. 14 are hereinafter referred to STI layers 1520 shown in FIG. 15. In embodiments of the present disclosure, the upper portion of STI layers 1420 in FIG. 14 may be recessed by an etching step. In embodiments of the present disclosure, the etching step may be performed using a wet etching process, for example, by dipping STI layers 1420 in hydrofluoric acid (HF). In some other embodiments, the etching step may be performed using a dry etching process, for example, the dry etching process may be performed using CHF3 or BF3 as etching gases.

Figure 16:
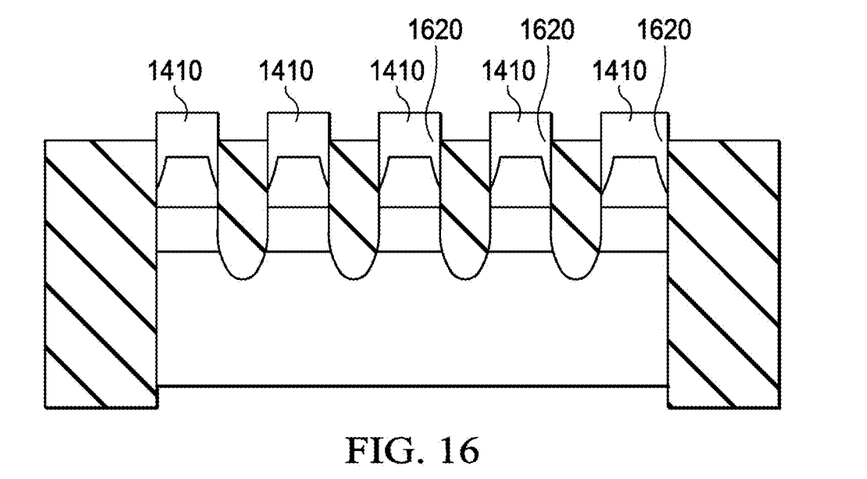

FIG. 16 illustrates a cross-sectional view of a FinFET structure at one of various stages of fabrication according to embodiments of the present disclosure. It should be noted that FIG. 16 illustrates a cross-sectional view of the FinFET structure taken along a direction in parallel with the X-direction of semiconductor device 100 shown in FIG. 1. Accordingly, the direction illustrated in FIG. 16 is in parallel with the direction of the width of fins.

In embodiments of the present disclosure, step 270 of method 200 in which the upper portion (SiGe portion) of fins are shaped may be an optional step such that the upper portion of fins may not be shaped. Then, method 200 of embodiments of the present disclosure continues with step 280 in which germanium (Ge) 1620 in first layer 1410 of the upper portion of is distributed to second layer 1420 of the upper portion of the fins, as shown in FIG. 16. In embodiments of the present disclosure, Ge within $SiGe_X$ materials in first layer 1410 of the upper portion of the fins may be diffused into second layer (include the $SiGe_Y$ material) of the upper portion of the fins by thermal treatment, such as an anneal activation in temperatures between 900 degree Celsius and 1100 degree Celsius. It should be noted that the temperature for Ge diffusion depends upon the concentration of Ge within $SiGe_X$ materials. For the SiGex materials with higher Ge concentration, Ge diffusion happens at the range between 900 degree Celsius and 1100 degree Celsius. In some embodiments of the present disclosure, the thermal treatment may be a separate step following the steps disclosed herein. In other embodiments, the thermal treatment may be a thermal budget in the subsequent processes.

Figure 17:
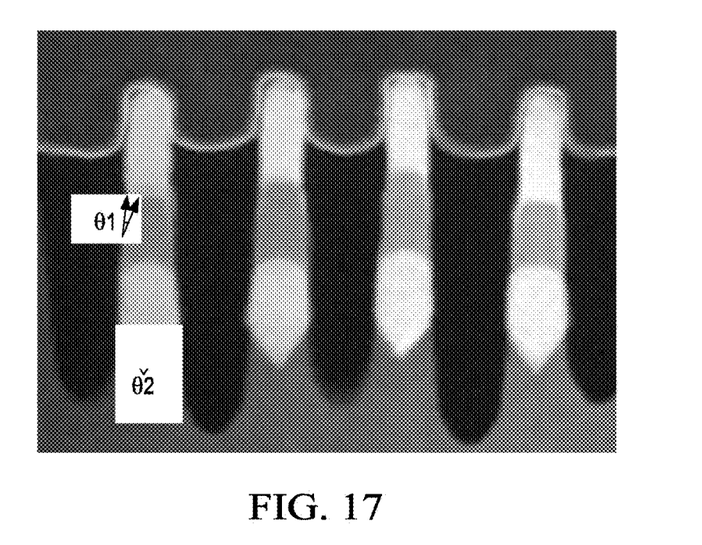

FIG. 17 illustrates a cross-sectional view of a FinFET structure at one of various stages of fabrication according to embodiments of the present disclosure. It should be noted that FIG. 17 illustrates a cross-sectional view of the FinFET structure taken along a direction in parallel with the X-direction of semiconductor device 100 shown in FIG. 1.

Accordingly, the direction illustrated in FIG. 17 is in parallel with the direction of the width of fins. Referring to FIG. 17, in embodiments of the present disclosure, the concentration of germanium within first layer 1410 is larger than that within second layer 1420 and germanium within first layer 1410 is diffused along the sidewalls of second layer 1420. Accordingly, the distribution of the concentration of germanium in first layer 1410 and second layer 1420 may be in a convex surface, as shown in FIG. 17. In embodiments of the present disclosure, the range of angle THETA 1 shown in FIG. 17 is between 20 and 40 degrees. In other embodiments of the present disclosure, the range of angle THETA 2 in an interface between third layer of upper (SiGe) portion and lower (Si) portion of the fins is between 40 and 80 degrees.

Referring back to FIG. 2, method 200 of embodiments of the present disclosure continues with step 290 in which following manufacturing process are performed. In embodiments of the present disclosure, method 200 may continue to include further CMOS or MOS technology processing to form various features known in the art. Exemplary processes that may be performed include the formation of gate structure, the formation of inter-layer dielectric (ILD) layer, and the formation of contact features coupled to the gate structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate having a fin, the fin having a first portion and a second portion, the second portion being over the first portion, the second portion providing a channel region of a transistor, the first portion being a first semiconductor material and the channel region being a second semiconductor material, wherein the first semiconductor material is different from the second semiconductor material; and
dielectric regions over the substrate along opposing sides of the fin, wherein the channel region has a convex upper surface and concave sidewalls extending from the convex upper surface to the dielectric regions;
wherein a surface of the first portion along an interface between the first portion and the second portion is a convex surface.

2. The semiconductor device of claim 1, wherein the second portion extends above an upper surface of the dielectric regions.

3. The semiconductor device of claim 1, wherein the first semiconductor material is silicon and the second semiconductor material is $Si_{1-x}Ge_x$, wherein $0<x<1$.

4. The semiconductor device of claim 1, further comprising a cap layer over the second portion, wherein the cap layer is a third semiconductor material.

5. The semiconductor device of claim 4, wherein the third semiconductor material is different from the first semiconductor material or the second semiconductor material.

6. The semiconductor device of claim 4, wherein the second semiconductor material is $Si_{1-x}Ge_x$, wherein $0<x<1$, and the third semiconductor material is $Si_{1-y}Ge_y$, wherein $0<y<1$, and x is different from y.

7. The semiconductor device of claim 1, further comprising a gate electrode extending along the concave sidewalls.

8. The semiconductor device of claim 1, wherein the angle at the interface between the first and the second portions at the sidewall of the first portion measured parallel to the top surface of the substrate is between 20 and 80 degrees.

9. A semiconductor device, comprising:
a semiconductor base extending from a substrate, the semiconductor base comprising a first semiconductor material;
shallow trench isolation (STI) extending along opposing sidewalls of the semiconductor base, an upper surface of the semiconductor base being recessed from an upper surface of the STI; and
a semiconductor layer over the semiconductor base, the semiconductor layer forming a channel region of a transistor, the channel region having a convex upper surface and extending from the semiconductor base to above the STI, the semiconductor base having a convex upper surface, a lower portion of the channel region is wider than an upper portion of the channel region, sidewalls of the channel region extending above the STI being concave, the channel region comprising a second semiconductor material, the first semiconductor material being different than the second semiconductor material.

10. The semiconductor device of claim 9, wherein the first semiconductor material is silicon and the second semiconductor material is $Si_{1-x}Ge_x$, wherein $0<x<1$.

11. The semiconductor device of claim 9, a cap layer over the channel, wherein the cap layer is a third semiconductor material.

12. The semiconductor device of claim 11, wherein the third semiconductor material is different from the second semiconductor material.

13. The semiconductor device of claim 12, wherein the third semiconductor material is different from the first semiconductor material.

14. The semiconductor device of claim 11, wherein the second semiconductor material is $Si_{1-x}Ge_x$, wherein $0<x<1$, and the third semiconductor material is $Si_{1-y}Ge_y$, wherein $0<y<1$ and x is different from y.

15. The semiconductor device of claim 9, further comprising a gate electrode extending directly over the STI and the channel region, the gate electrode extending directly over concave portions of the sidewalls of the channel region.

16. A semiconductor device, comprising:
a substrate having a first trench and a second trench;
isolation regions in the first trench and the second trench;
a first semiconductor layer on the substrate, the first semiconductor layer being interposed between the isolation regions, a lower surface of the first semiconductor layer having a concave surface, wherein the first semiconductor layer is made of a material different from that of the substrate;
a second semiconductor layer on top of the first semiconductor layer, the second semiconductor layer being made up of a different material from the first semiconductor layer;
a third semiconductor layer on top of the second semiconductor layer, the third semiconductor layer being made of a same material to the first semiconductor layer, the third semiconductor layer forming a channel region of a transistor; and a gate structure extending over an upper surface and sidewalls of the third semiconductor layer, the semiconductor layer extending completely under the gate structure.

17. The semiconductor device of claim 16, a bottom of the first semiconductor layer is wider than a top of the third semiconductor layer.

18. The semiconductor device of claim 16, wherein sidewalls of the third semiconductor layer are concave.

19. The semiconductor device of claim 16, wherein an upper surface of the third semiconductor layer is rounded.

20. The semiconductor device of claim 16, wherein the substrate is silicon, the first and third semiconductor layers are $Si_{1-x}Ge_x$, the second semiconductor layer is $Si_{1-y}Ge_y$, wherein $0<x<1$ and $0<y<1$.

* * * * *

UNITED STATES PATENT AND TRADEMARK OFFICE
CERTIFICATE OF CORRECTION

PATENT NO. : 10,504,993 B2  
APPLICATION NO. : 15/383974  
DATED : December 10, 2019  
INVENTOR(S) : Yi-Jing Lee et al.

Page 1 of 1

It is certified that error appears in the above-identified patent and that said Letters Patent is hereby corrected as shown below:

In the Claims

In Column 15, Lines 2-4, Claim 16, delete ", the semiconductor layer extending completely under the gate structure".

Signed and Sealed this  
Thirty-first Day of March, 2020

Andrei Iancu  
*Director of the United States Patent and Trademark Office*